United States Patent
Wang et al.

(10) Patent No.: US 7,656,721 B2
(45) Date of Patent: Feb. 2, 2010

(54) SEMICONDUCTOR DEVICE

(75) Inventors: Ming-Shiang Wang, Taoyuan County (TW); Wei-Li Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 95 days.

(21) Appl. No.: 11/952,976

(22) Filed: Dec. 7, 2007

(65) Prior Publication Data

US 2008/0279019 A1    Nov. 13, 2008

(30) Foreign Application Priority Data

May 10, 2007    (TW) ............................. 96116657 A

(51) Int. Cl.
G11C 16/04    (2006.01)

(52) U.S. Cl. ................... 365/189.09; 365/205; 365/190; 365/207

(58) Field of Classification Search ................. 365/205, 365/189.09, 190, 207, 203, 208
See application file for complete search history.

(56) References Cited

U.S. PATENT DOCUMENTS

| 6,504,777 B1 * | 1/2003 | Hsu et al. ................... 365/205 |
| 7,061,817 B2 * | 6/2006 | Raad et al. .................. 365/201 |
| 7,266,030 B2 * | 9/2007 | Do et al. ..................... 365/207 |

* cited by examiner

*Primary Examiner*—David Lam
(74) *Attorney, Agent, or Firm*—Quintero Law Office

(57) ABSTRACT

A semiconductor includes a first sensor amplifier, a second sensor amplifier, a first switch and a second switch. The first sensor amplifier is coupled between a local data line and a memory unit to amplify signals of the memory unit. The second sensor amplifier is coupled to a middle data line to amplify signals of the middle data line. The first switch is coupled between the middle data line and the local data line to equalize voltage levels between the middle data line and the local data line by turning on the first switch according to a data control signal. The second switch is coupled between the local data line and a reference voltage to equalize the local data line to the voltage level of the reference voltage by turning on the second switch according to a local data control signal.

11 Claims, 3 Drawing Sheets

SEMICONDUCTOR DEVICE

BACKGROUND OF THE INVENTION

1. Field of the Invention

The invention relates to a memory, and, in particular, relates to a column sharing structure memory.

2. Description of the Related Art

FIG. 1 is a conventional memory structure 100. A memory structure 100 comprises a memory unit 110, a sensor amplifier (SA) 120, switches 128 and 130, a second sensor amplifier (SSA) 140, an output terminal 150, a word line WL0, a bit line BL0, a local data line LDQ and a middle data line MDQ.

The sensor amplifier 120 detects and amplifies signals stored in the memory unit 110 and transmits the signals to the local data line LDQ. When the signal stored in memory unit 110 is at a high voltage level, the local data line LDQ is at a high voltage level. When the signal stored in the memory unit 110 is at a low voltage level, the local data line LDQ is at a low voltage level. Simultaneously, the middle data line MDQ is pulled high to a high voltage level in advance by the second sensor amplifier 140. The data control signal DQSW turns on the switch 130 to equalize voltage levels of the local data line LDQ and the middle data line MDQ. If the local data line LDQ is at a high voltage level, after turning on the switch 130, the local data line LDQ and the middle data line MDQ are both at a high voltage level. If the local data line LDQ is at a low voltage level, after turning on the switch 130, the local data line LDQ and the middle data line MDQ are both at a low voltage level. The second sensor amplifier 140 detects a voltage level of the middle data line MDQ and outputs signals of the middle data line MDQ to output terminal 150. However, with demands for memory capacity to increase, methods to increase memory capacity, reduce size of the memory or decrease number of devices in the memory have become more and more important.

BRIEF SUMMARY OF THE INVENTION

A detailed description is given in the following embodiments with reference to the accompanying drawings.

An embodiment of a semiconductor device is provided. The semiconductor device comprises a first sensor amplifier, a second sensor amplifier, a first switch and a second switch. The first sensor amplifier is coupled between a local data line and a memory unit to amplify signals of the memory unit. The second sensor amplifier is coupled to a middle data line to amplify signals of the middle data line. The first switch is coupled between the middle data line and the local data line to equalize voltage levels between the middle data line and the local data line by turning on the first switch according to a data control signal. The second switch is coupled between the local data line and a reference voltage to equalize the local data line to the voltage level of the reference voltage by turning on the second switch according to a local data control signal.

Another embodiment of a semiconductor device is provided. The semiconductor device comprises a first, first sensor amplifier, a second, first sensor amplifier, a second sensor amplifier, a first switch, a second switch, a third switch and a fourth switch. The first, first sensor amplifier is coupled between a first local data line and a first memory unit to amplify a signal of the first memory unit. The second, first sensor amplifier is coupled between a second local data line and a second memory unit to amplify a signal of the second memory unit. The second sensor amplifier is coupled to a middle data line to amplify a signal of the middle data line. The first switch is coupled between the middle data line and the first local data line to equalize voltage levels of the middle data line and the first local data line by turning on the first switch according to a first data control signal. The second switch is coupled between the first local data line and a reference voltage to equalize a voltage level of the first local data line to the reference voltage by turning on the second switch according to a first local data control signal. The third switch is coupled between the middle data line and the second local data line to equalize voltage levels of the middle data line and the second local data line by turning on the third switch according to a second data control signal. The fourth switch is coupled between the second local data line and the reference voltage to equalize the voltage level of the second local data line to the reference voltage by turning on the fourth switch according to a second local data control signal.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
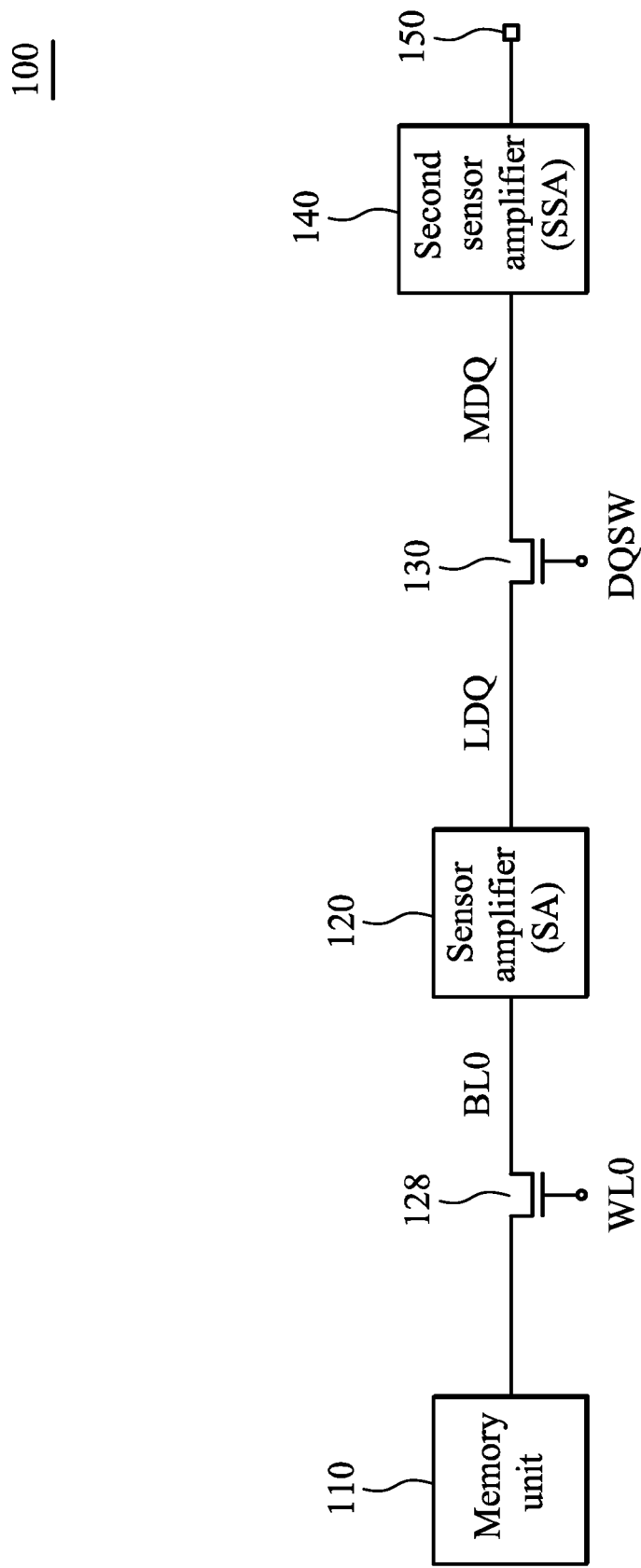
FIG. 1 is a conventional memory structure.
Figure 2:
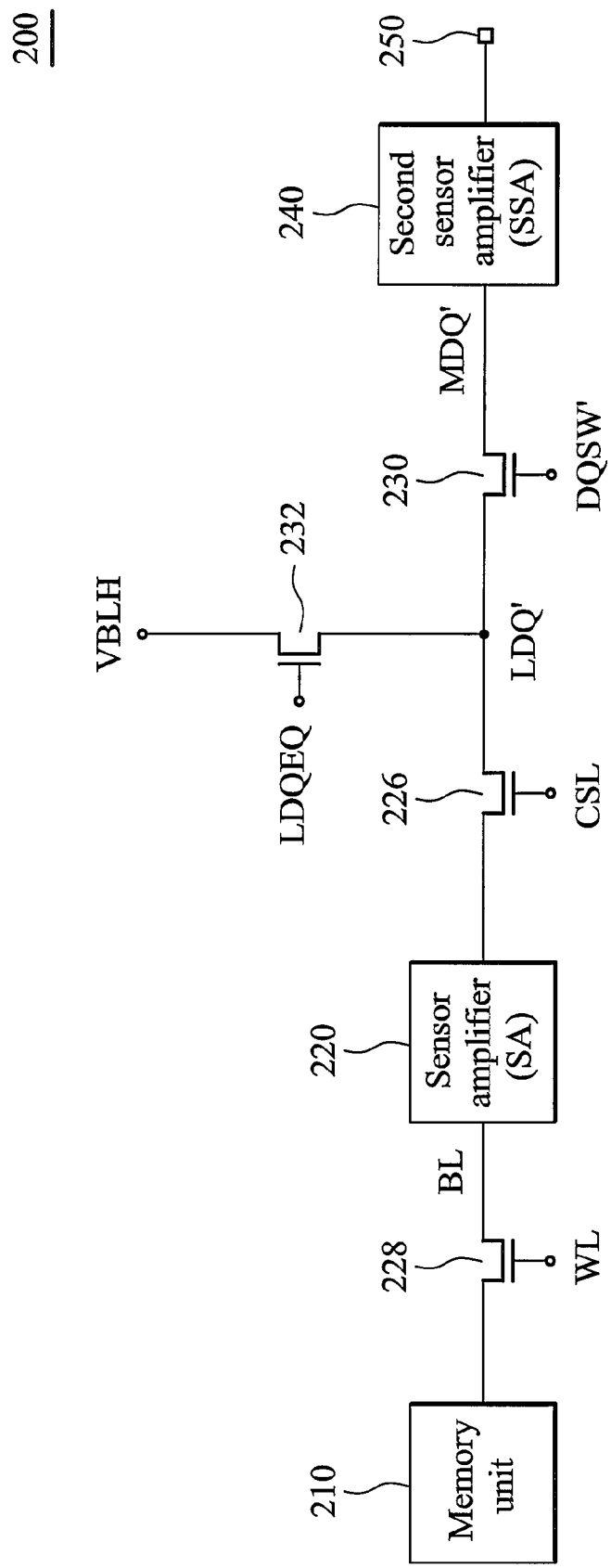
FIG. 2 is a memory structure according to an embodiment of the invention.

FIG. 2 is memory structure 200 according to an embodiment of the invention. The memory structure 200 comprises a memory unit 210, a sensor amplifier (SA) 220, switches 226, 228, 230 and 232, a second sensor amplifier (SSA) 240, an output terminal 250, a word line WL, a bit line BL, a column selecting line CSL, a local data line LDQ' and middle data line MDQ'. According to an embodiment of the invention, the switches 226, 228, 230 and 232 are MOS transistors.

The sensor amplifier 220 is coupled between the switches 226 and 228. During reading of the memory unit 210, the switch 228 is turned on by the word line signal of the word line WL and the sensor amplifier 220 reads and amplifies the signal which is stored in the memory unit 210. The signal of the column selecting line CSL turns on the switch 226 to output the signal of sensor amplifier 220 to the local data line LDQ'. When the switches 228 and 226 are turned on, the sensor amplifier 220 is coupled to the local data line LDQ' and the memory unit 210 directly. It is noted that the local data line LDQ' is charged to the reference voltage VBLH in advance. The second sensor amplifier 240 is coupled to the middle data line MDQ' to amplify the signal of the middle data line MDQ'. The switch 232 is coupled between the local data line LDQ' and the reference voltage VBLH and is turned on according to the local data control signal LDQEQ (reading/writing control signal) for the voltage level of the local data line LDQ' to be the same as the reference voltage VBLH. After the voltage level of the local data line LDQ' is the same as the reference voltage VBLH, the sensor amplifier 220 transmits the signal of the memory unit 210 via the switches 228 and 226 to the local data line LDQ' to decide the voltage level of the local data line LDQ'. If the signal stored in the memory unit 210 is at a high voltage level (reference voltage VBLH), the signal of the local data line LDQ' is at a high voltage level. If the signal stored in the memory unit 210 is at a low voltage level, the signal of the local data line LDQ' is at a low voltage level.

The second sensor amplifier 240 raises the voltage level of the middle data line MDQ in advance. The switch 230 is coupled between the middle data line MDQ' and the local data line LDQ' and is turned on according to the data control signal (reading/writing control signal) DQSW' to equalize the voltage levels of the middle data line MDQ' and the local data line LDQ'. After the sensor amplifier 220 transmits the signal of the memory unit 210 through the switch 226 to the local data line LDQ', the switch 230 is turned on to equalize the voltage levels of the middle data line MDQ' and the local data line LDQ'. If the local data line is at a high voltage level, after turning on the switch 230, both the local data line LDQ' and the middle data line MDQ' are at a high voltage level. If the local data line is at a low voltage level, after turning on the switch 230, both the local data line LDQ' and the middle data line MDQ' are at a low voltage level. The second sensor amplifier 240 detects the voltage level of the middle data line MDQ' and outputs the signal of the middle data line MDQ' to the output terminal 250. Since the memory structure 200 comprises the column selecting line CSL and the switch 226, the memory unit 210 can be used in a column sharing structure memory. A plurality of memory units can form a memory array.

Figure 3:
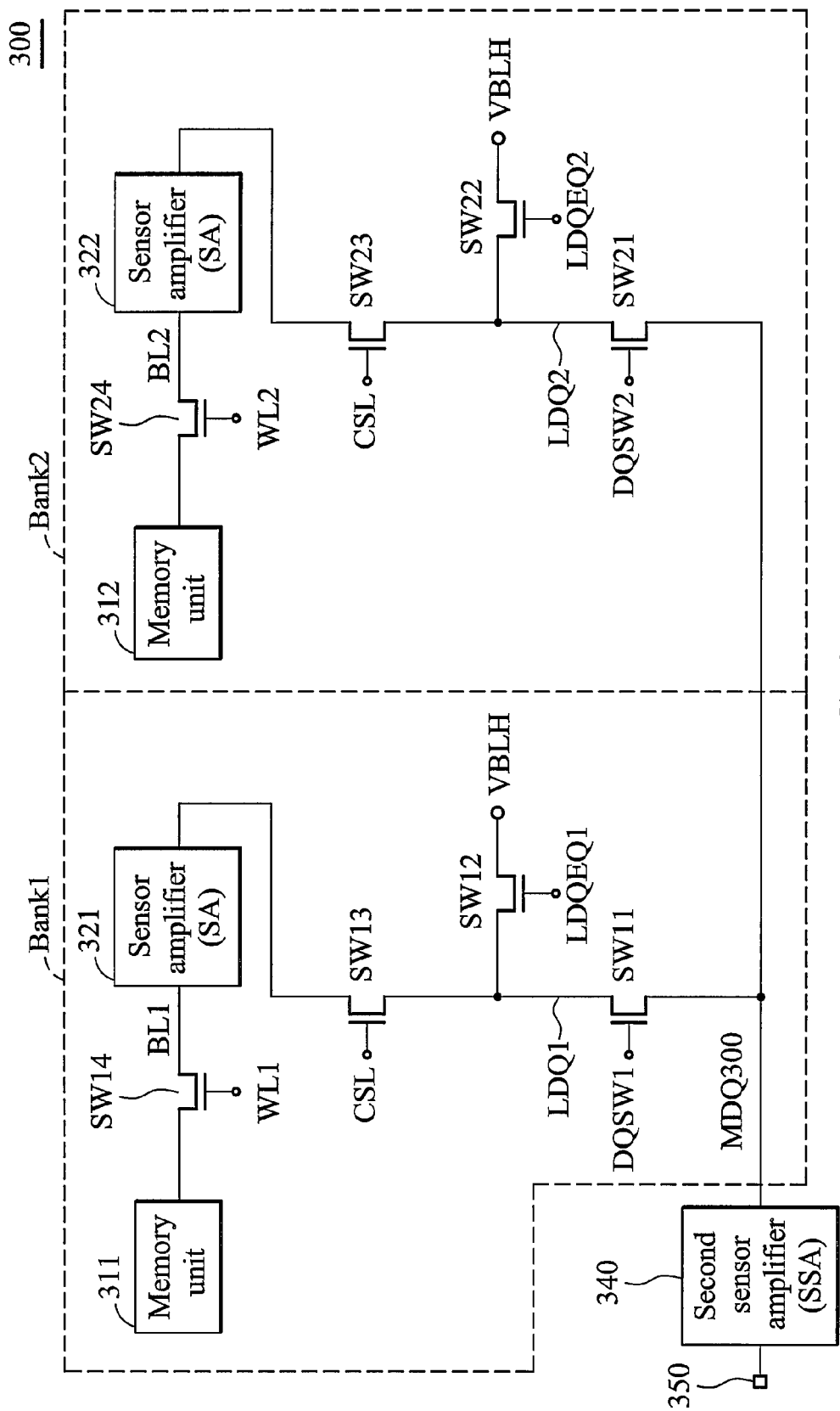
FIG. 3 is a memory structure according to another embodiment of the invention

FIG. 3 is memory structure 300 according to another embodiment of the invention. The memory structure 300 comprises memory units 311 and 312, sensor amplifiers 321 and 322, switches SW11, SW12, SW13, SW14, SW21, SW22, SW23 and SW24, a second sensor amplifier 340, an output terminal 350, word lines WL1 and WL2, bit lines BL1 and BL2, a column selecting line CSL, local data lines LDQ1 and LDQ2 and middle data line MDQ300. According to an embodiment of the invention, switches SW11, SW12, SW13, SW14, SW21, SW22, SW23 and SW24 are MOS transistors.

The sensor amplifier 321 is coupled between the switch SW14 and SW 13. During reading of the memory unit 311, the word line signal of the word line WL1 turns on the switch SW14 and the sensor amplifier reads and amplifies the stored signal of the, memory unit 311. The signal of the column selecting line CSL turns on the switch SW13 to output the signal of the sensor amplifier 321 to the local data line LDQ1. When the switches SW14 and SW13 are turned on, the sensor amplifier 321 is coupled to the local data line LDQ1 and the memory unit 311 directly. It is noted that the local data line LDQ1 is charged to the reference voltage VBLH in advance. The operation of the memory unit 312, the sensor amplifier 322, the switches SW24 and SW23 are substantially the same as those previously described and is not described again for brevity.

The second sensor amplifier 340 is coupled to the middle data line MDQ300 to amplify the signal of middle data line MDQ300. The switch SW11 is coupled between the middle data line MDQ300 and the local data line LDQ1 and is turned on according to the data control signal (reading/writing control signal) DQSW1 to equalize the voltage level of middle data line MDQ300 to the voltage level of the local data line LDQ1. The switch SW12 is coupled between the local data line LDQ1 and the reference voltage VBLH and is turned on according to the local data control signal (reading/writing control signal) LDQEQ1 for the voltage of the local data line LDQ1 to be the reference voltage VBLH. According to another embodiment of the invention, the reference voltage VBLH is at a high voltage level. The switch SW21 is coupled between the middle data line MDQ300 and the local data line LDQ2 and is turned on according to the data control signal (reading/writing control signal) DQSW2 to equalize the voltage level of the middle data line MDQ300 to the voltage level of the local data line LDQ2. The switch SW22 is coupled between the local data line LDQ2 and the reference voltage VBLH and is turned on according to the local data control signal (reading/writing control signal) LDQEQ2 for the voltage level of the local data line LDQ2 to be the reference voltage VBLH. It is not limited that the memory structure comprises only two memory banks and can comprise more memory banks. The operations and connecting relations of corresponding local data lines, memory units, switches and sensor amplifiers for added memory banks are similar to those described in the above embodiments, and will not be described again for brevity.

For simplicity, the memory structure 300 with two memory units 311 and 312, two sensor amplifiers 321 and 322 and switches SW11, SW12, SW13, SW14, SW21, SW22, SW23 and SW24 are used as an example. When the memory unit 311 is accessed, the second sensor amplifier 340 raises the voltage of the middle data line MDQ300 in advance. The switch SW12 is turned on for the voltage level of the local data line LDQ1 to be the reference voltage VBLH (avoiding the voltage level of local data line LDQ1 to float). According to an embodiment, the reference voltage VBLH is at a high voltage level. Sensor amplifier 321 transmits the signal of the memory unit 311 via the switches SW14 and SW13 to the local data line LDQ1 to decide the voltage level of the local data line LDQ1. If the signal stored in the memory unit 311 is at a high voltage level (reference voltage VBLH), the voltage level of the local data line LDQ1 is at a high voltage level. If the signal stored in the memory unit 311 is at a low voltage level, the voltage level of the local data line LDQ1 is at a low voltage level. Thus, if the voltage level of the local data line LDQ1 is at a high voltage level, after turning on switch SW11, the voltage levels of the local data line LDQ1 and the middle data line MDQ300 are at a high voltage level. If the voltage level of the local data line LDQ1 is at a low voltage level, after turning on the switch SW11, the voltage levels of the local data line LDQ1 and the middle data line MDQ300 are at a low voltage level. After turning on the switch SW11, the second sensor amplifier 340 detects the voltage level of the middle data line MDQ300 and outputs the signal of the middle data line MDQ300 to output terminal 350. However, the switches SW11 and SW12 will not be on simultaneously.

When the memory unit 312 is accessed, the second sensor amplifier 340 raises the voltage level of the middle data line MDQ300 in advance. The switch SW22 is turned on for the voltage level of the local data line LDQ2 to be the reference voltage VBLH. The sensor amplifier 322 transmits the signal of the memory unit 312 via the switches SW24 and SW23 to the local data line LDQ2 to decide the voltage level of the local data line LDQ2. If the signal stored in the memory unit 312 is at a high voltage level (reference voltage VBLH), the voltage level of the local data line LDQ2 is at a high voltage level. If the signal stored in the memory unit 312 is at a low voltage level, the voltage level of the local data line LDQ2 is at a low voltage level. Thus, if the voltage level of the local data line LDQ2 is at a high voltage level, after turning on switch SW21, both the local data line LDQ2 and the middle data line MDQ300 are at a high voltage level. If the voltage level of the local data line LDQ2 is at a low voltage level, after turning on switch SW21, both the local data line LDQ2 and the middle data line MDQ300 are at a low voltage level. After turning on the switch SW21, the second sensor amplifier 340 detects the voltage level of the middle data line MDQ300 and outputs the signal of the middle data line MDQ300 to the output terminal 350. In addition, the switches SW21 and SW22 will not be turned on simultaneously. It is noted that the switches SW11 and SW21 are not turned on simultaneously to avoid two signals of the local data lines LDQ1 and LDQ2 conflicting with middle data line MDQ300. According to an embodiment of the invention, the memory structure 300 can comprise more than two memory banks and can be applied in a column sharing structure memory to decrease quantity of memory devices to reduce the size or increase memory capacity. It is noted that the local data lines LDQ', LDQ1 and LDQ2 and the middle data lines MDQ' and MDQ300 can be differential for providing differential signal.

While the invention has been described by way of example and in terms of preferred embodiment, it is to be understood that the invention is not limited to thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising
    a first sensor amplifier coupled between a first local data line and a first memory unit to amplify a signal of the first memory unit;
    a second sensor amplifier coupled between a second local data line and a second memory unit to amplify a signal of the second memory unit;
    a third sensor amplifier coupled to a middle data line to amplify signals of the middle data line;
    a first switch coupled between the middle data line and the first local data line to equalize voltage levels of the middle data line and the first local data line by turning on the first switch according to a first data control signal;
    a second switch coupled between the first local data line and a reference voltage to equalize a voltage level of the first local data line to the reference voltage by turning on the second switch according to a first local data control signal;
    a third switch coupled between the middle data line and the second local data line to equalize voltage levels of the middle data line and the second local data line by turning on the third switch according to a second data control signal; and
    a fourth switch coupled between the second local data line and the reference voltage to equalize the voltage level of the second local data line to the reference voltage by turning on the fourth switch according to a second local data control signal.

2. The semiconductor device as claimed in claim 1, wherein after the second switch is turned on to equalize the voltage level of the first local data line to the reference voltage, the first sensor amplifier transmits the signal of the first memory unit to the first local data line to decide the voltage level of the first local data line.

3. The semiconductor device as claimed in claim 2, wherein after the fourth switch is turned on to equalize the voltage level of the second local data line to the reference voltage, the second sensor amplifier transmits the signal of the second memory unit to the second local data line to decide the voltage level of the second local data line.

4. The semiconductor device as claimed in claim 2, wherein after the first sensor amplifier transmits the signal of the first memory unit to the first local data line, the first switch is turned on to equalize the voltage levels of the middle data line and the first local data line.

5. The semiconductor device as claimed in claim 4, wherein after the second sensor amplifier transmits the signal of the second memory unit to the second local data line, the third switch is turned on to equalize the voltage levels of the middle data line and the second local data line.

6. The semiconductor device as claimed in claim 5, wherein the first and second switches are turned on respectively and the third and fourth switches are turned on respectively.

7. The semiconductor device as claimed in claim 6, wherein when the first switch is turned on, the third sensor amplifier detects the voltage level of the first local data line and when the second switch is turned on, the third sensor amplifier detects the voltage level of the second local data line.

8. The semiconductor device as claimed in claim 1, wherein the first, second, third and fourth switches are MOS transistors.

9. The semiconductor device as claimed in claim 1, wherein the third sensor amplifier raises the voltage level of the middle data line.

10. The semiconductor device as claimed in claim 1, wherein the first and second memory units are column sharing structure memory units.

11. The semiconductor device as claimed in claim 1, wherein the first and second data control signals and the first and second local data control signals are reading/writing control signals.

* * * * *